United States Patent [19]
Marley

[11] 3,946,246
[45] Mar. 23, 1976

[54] FULLY COMPENSATED EMITTER COUPLED LOGIC GATE

[75] Inventor: Robert R. Marley, Phoenix, Ariz.

[73] Assignee: Motorola, Inc., Chicago, Ill.

[22] Filed: Sept. 3, 1974

[21] Appl. No.: 502,473

[52] U.S. Cl. ............... 307/218; 307/215; 330/30 D
[51] Int. Cl.² ...................................... H03K 19/08
[58] Field of Search ........... 307/218, 215; 330/30 D

[56] References Cited
UNITED STATES PATENTS

| | | | |
|---|---|---|---|
| 3,590,274 | 6/1971 | Marley | 307/218 X |
| 3,758,791 | 9/1973 | Taniguchi et al. | 307/218 X |
| 3,806,736 | 4/1974 | Wilhelm | 307/218 X |

Primary Examiner—John S. Heyman
Attorney, Agent, or Firm—Harry M. Weiss; Kenneth R. Stevens

[57] ABSTRACT

A circuit for minimizing voltage excursions on the emitter-follower output terminals of an emitter coupled logic (ECL) gate including a compensating circuit connected to collector nodes associated with the input switching transistors and the reference switching transistor. The compensating circuit comprises a single current source for continuously delivering current which is selectively applied in predetermined amounts to one of the collector nodes residing in a high state. This predetermined amount of current compensates for undesired voltage changes experienced at the load impedance connected to that node due to varying ambient temperatures effecting the base-emitter junction of the output emitter follower transistor.

9 Claims, 3 Drawing Figures

FULLY COMPENSATED EMITTER COUPLED LOGIC GATE

BACKGROUND OF THE INVENTION

1. Field of Invention

This invention relates to a switching circuit and more particularly a temperature compensated emitter coupled logic gate.

2. Description of Prior Art

Many circuits exist for temperature and voltage compensation of basic logic circuits. In an emitter coupled logic gate, the output logic signal is generated at the emitter terminal of an emitter-follower output transistor. Without temperature compensation this output logic level varies due to the negative temperature coefficient associated with the base-to-emitter junction of the transistor. That is, as the temperature increases, the base-to-emitter voltage drop, $V_{BE}$, decreases, and conversely with a decrease in temperature the $V_{BE}$ increases. Since the noise immunity of any logic gate is related to the stability of the output logic level, any variations of the output logic signal due to temperature changes deleteriously affects the noise margin or noise immunity of the switching circuit.

Compensation circuits using back-to-back diodes and current sources have been suggested for improving the performance of ECL gates. However, this solution limits the overall speed of the logic gate due to the requirement of charging certain collector nodes in the circuit, and furthermore, certain rounding of the DC transfer and power supply characteristic curves are experienced thus reducing the noise immunity or noise margin of the circuit.

Also, some compensating circuits employ a plurality of current sources which are always connected to collector node associated with either the reference transistor or the input switching transistors in order to compensate for output voltage variations due to changes in the base-to-emitter drops associated with the emitter-follower output transistor during ambient temperature changes. However, these ECL gates suffer in their switching speed response in that the two collector nodes additional stray capacitance must be charged every time the logic gate switches states. Moreover, these prior art solutions require a greater number of components and consume a commensurate greater amount of power.

SUMMARY OF THE INVENTION

It is therefore an object of the present invention to provide an improved ECL gate of simplified device complexity.

Another object of the present invention is to provide an improved ECL gate capable of switching at faster speeds.

A further object of the present invention is to provide an improved ECL gate having improved power dissipation and noise immunity characteristics.

In accordance with the aforementioned objects, the present invention provides a compensating circuit for an emitter coupled logic gate which is connected to the collector nodes of the input switching transistors and to the collector node of the reference switching transistor for selectively providing a predetermined amount of current to the load impedance connected to an associated high or "on" side collector terminal from a single current source by means of a pair of steering diodes in order to compensate for voltage variations at the emitter-follower output terminal due to ambient temperature changes.

DESCRIPTION OF THE PREFERRED EMBODIMENTS

Figure 1:
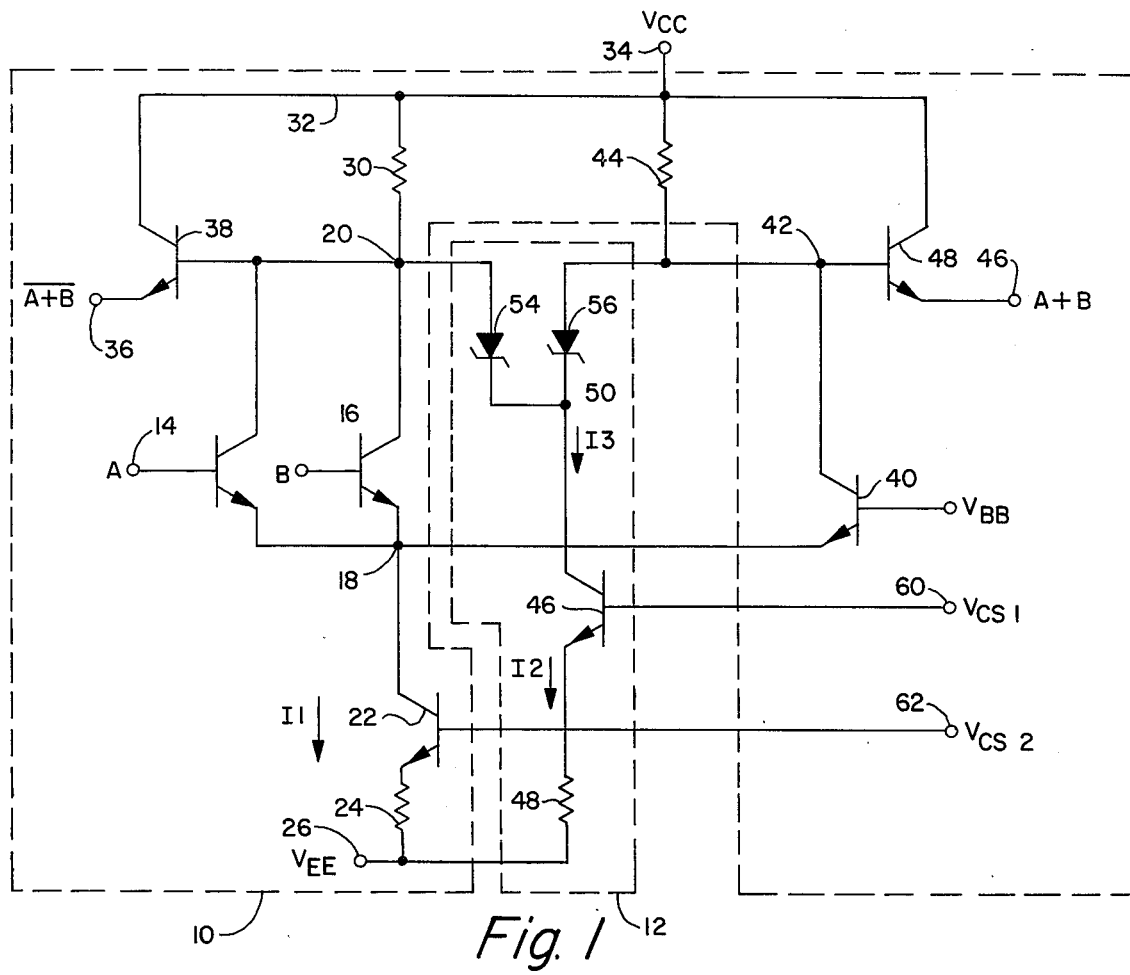
FIG. 1 is a schematic diagram illustrating a basic conventional emitter coupled logic gate connected to an improved temperature compensating circuit.

Now referring to FIG. 1, it illustrates a conventional emitter coupled logic gate 10 connected to a circuit means 12 for providing temperature compensation thereto. The logic gate 10 includes a plurality of input switching transistors 14 and 16 connected between a first common emitter node 18 and a second collector node 20. The base terminals of the input switching transistors 14 and 16 are adapted to receive logic signals A and B, respectively. A first current source comprising transistor 22 and resistor 24 is serially interconnected between node 18 and a negative supply voltage $V_{EE}$ connected to a terminal 26. A load impedance or resistor 30 is connected between node 20 and the positive voltage supply $V_{CC}$ (ground in the preferred embodiment) connected to common line 32 by means of terminal 34. The NOR or out-of-phase side of the logic gate 10 is constituted by an output terminal 36 which is the emitter terminal of an emitter-follower output transistor 38 having its base terminal connected to node 20 for generating the logic output signal $\overline{A+B}$.

A reference switching transistor 40 is connected at its emitter terminal to node 18 and at its collector terminal to another node 42. Impedance or load means for the reference switching transistor 40 is constituted by a resistor 44 connected between line 32 and node 32. Similarly, the OR or in-phase output signal from the logic gate 10 is provided at an output terminal 46 comprising the emitter terminal of an emitter-follower output transistor 48 connected at its base terminal to node 42 and at its collector terminal to line 32 for generating an output logic signal A+B. The base terminal of reference switching transistor 40 is connected to a reference supply voltage $V_{BB}$ as is well known in the art, and is approximately −1.30 volts in the preferred embodiment.

The circuit means 12 for temperature compensating the logic gate 10 is constituted by a single current source comprising transistor 46 and resistor 48 serially interconnected between node 50 and terminal 26 connected to the negative supply voltage $V_{EE}$.

In order to selectively provide a predetermined amount of current to either node 20 or 42, node 50 is connected to switching means comprising a pair of unilaterally conducting diodes 54 and 56. In a preferred embodiment diodes 54 and 56 comprise Schottky barrier diodes since they are readily implemented in integrated circuit form into the collector terminals of the input switching transistors 14 and 16 or the reference switching transistor 40. Again, the in-phase logic level generated from logic gate 10 is provided at output terminal 46 is A+B.

The circuit shown in FIG. 1 is temperature compensated. However, it is to be realized that each of the current sources comprising transistor 46 and resistor 48 and transistor 22 and resistor 24 can be connected to a voltage source designated $V_{CS1}$ and $V_{CS2}$, respectively. Many bias drivers or voltage sources which are either temperature or voltage compensated or both temperature and voltage compensated can be interconnected to the terminals 60 or 62 depending upon the level of performance required for the logic gate itself. Furthermore, it is to be realized that a single voltage-temperature compensated circuit can be used to provide voltages to both terminals 60 and 62 if desired. One bias driver or temperature and/or voltage compensated circuit suitable for driving terminals 60 and 62, inter alia, is disclosed in U.S. application Ser. No. 447,198, filed Mar. 1, 1974, and assigned to the same assignee as the present invention.

OPERATION

For purposes of explanation it is assumed that an up level is constituted by pulling −.9 volts or −900mv and a down level is −1.7 volts. Assuming an up level logic signal A at the base terminal of transistor 14, then transistor 14 is rendered conductive and a current I1 is caused to flow. With I1 flowing, node 20 is at a down level. Similarly, reference switching transistor 40 is nonconductive and thus node 42 is in an up level and thus a high or up level is generated at output terminal 46. Discounting temperature or voltage variations, the magnitude of the output logic level at output terminal 46 is determined by the magnitude of the supply voltages, the load resistors, and the resistors associated with the current sources, as is well known in the art, although −900mv and −1700mv are selected in the preferred embodiment.

Without the compensating circuit 12 it can be seen with an increase in temperature the base-to-emitter voltage drop across transistor 48 decreases due to the inherent negative coefficient of temperature associated with semiconductor transistors and thus the output voltage at terminal 46 becomes more positive than the desired level of −900mv constituting an up level.

Circuit 12 compensates for this voltage change in the following manner. For these assumed logical conditions, node 20 maintains Schottky diode 54 nonconductive. However, with node 42 at a relatively high state, Schottky diode 56 is conductive and presents an extremely low forward voltage to the circuit. The increase in temperature which caused the output logic signal on terminal 46 to become more positive, for example, −800mv, also affects the base-to-emitter junction of transistor 46, thus increasing its emitter current I2 by a predetermined amount. Since the voltage applied to the base of transistor 46, $V_{CS1}$, is substantially constant then the collector current I3 flowing through Schottky diode 56 must also increase. Since I3 also flows through impedance or resistor 44, an increase in I3 increases the voltage drop across resistor 44 between line 32 and node 42. This increased voltage drop across resistor 44 in turn compensates node 42 so as to lower its net overall voltage in order to compensate for the more positive voltage resulting from the decreased $V_{BE}$ drop across transistor 48. Accordingly, the output voltage or logic signal level at output terminal 46 is compensated to closely reside at the desired logic or up level of −900mv regardless of temperature.

In a similar manner, Schottky diode 64 and the single current source comprising transistor 46 and resistor 48 provides compensation to the out-of-phase or NOR output terminal 36 when node 20 resides in a high or up state.

Although not part of the present invention, it is to be realized that the current source comprising transistor 22 and resistor 24 provides temperature compensation to the low or down side collector nodes in a manner known in the prior art.

Figure 2:
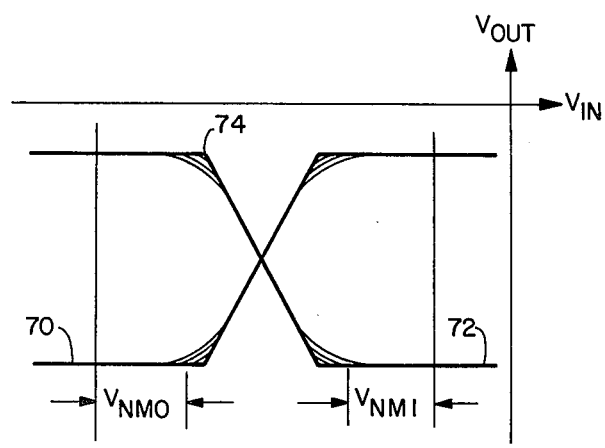
FIG. 2 illustrates a DC transfer and power supply characteristic curve for a prior art ECL gate having temperature compensation and illustrates the lower noise immunity of that circuit.

Now referring to FIG. 2, it illustrates a DC transfer and power supply characteristic curve 72 for the out-of-phase NOR side of the logic gate 10 and curve 70 for the in-phase or OR side of the logic gate 10. At each of the corners, for example corner 74, it is to be noted that as the temperatures increase the curve becomes more rounded with a commensurate loss in noise immunity. The distance $V_{NM0}$ represents the voltage noise margin for a binary 0 logic state at the NOR side, and the distance $V_{NM1}$ represents the voltage noise margin for a binary 1 at the OR side of the logic gate 10. This particular characteristic is exhibited by prior art compensating circuits which employ back-to-back diodes connected in series with a resistor between the collector terminals of the input switching transistor and the reference switching transistor of an ECL gate. Actually, this curving at the corner 74 represents a gain loss which is caused by one of the back-to-back diodes being conductive or on during either a high or a low level corresponding to a binary 1 or a binary 0 level. In the prior art this clamping action of the back-to-back diodes generates the temperature compensation.

Figure 3:
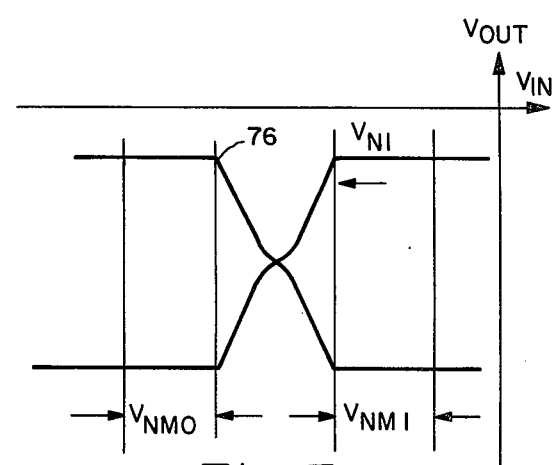
FIG. 3 is a DC transfer and power supply characteristic curve of the present invention illustrating the improved noise immunity achieved by employing the compensating circuit of the present invention.

FIG. 3 illustrates the DC transfer and power supply characteristic curves for the present invention. It can be seen that despite increases in temperature the corners of the curve, for example, corner 76 remains angular and is not rounded. Accordingly, the present compensating circuit ECL improves the noise immunity of the compensated ECL gate. It is to be noticed that in this instance there is a slight perturbation in the middle portion of the switching curves which reflects a slight loss of gain at this time. However, this loss of gain does not result when the logic gate is in a quiescent binary 1 or binary 0 state and hence does not affect noise immunity of the circuit. In the present invention, both the diodes are conductive or both on only in the middle switching region but only one diode is on or conductive during a quiescent binary one or zero level and thus the corner such as 76 remains angular despite temperature variations.

What is claimed is:

1. A circuit for minimizing voltage excursions on the emitter output terminals of an emitter-follower coupled logic gate due to temperature changes comprising:
   a. an emitter-follower current switch logic gate having at least one input switching transistor and a reference transistor;
   b. a first common node and a first current source connected thereto for providing current for either said input switching transistor or said reference transistor;
   c. said first common node being connected to the emitter terminals of said input switching transistor and said reference transistor;
   d. a second node connected to the collector terminal of said input switching transistor, and a first impedance means connected between said second node and a first supply means, e. a third node connected to the collector of said reference transistor, and a second impedance means connected between said third node and the first supply means;

f. first and second emitter-follower output transistors connected at their base terminals to said second and third nodes, respectively;

g. the emitter terminals of said first and second emitter-follower output transistors being responsive to logical input signals at the base terminal of said input switching transistor for generating predetermined logical output signals;

h. circuit means connected to said second and third nodes for minimizing voltage excursions of the logical output signals being generated from a predetermined one of said emitter follower output transistors having its base terminal connected to the collector terminal of a nonconducting input switching transistor or a nonconducting reference transistor, and i. said circuit means comprising a second current source for continuously generating a predetermined amount of current, j. switching means connected to said second current source and to said second and third nodes for selectively applying said predetermined amount of current only to said second or said third node.

2. A circuit for minimizing voltage excursions on the emitter output terminals of an emitter-follower coupled logic gate due to temperature changes as in claim 1 wherein:

a. said first current source comprises a transistor and a serially interconnected impedance means connected between said first node and a second supply means; and b. the base terminal of said first current source transistor being connected to a compensated voltage source means for minimizing voltage excursions at the other emitter-follower output terminal due to temperature changes at the other predetermined emitter-follower output transistor having its base terminal connected to the collector terminal of either a conductive input switching transistor or a conductive reference switching transistor.

3. A circuit for minimizing voltage excursions on the emitter output terminals of an emitter-follower coupled logic gate due to temperature changes as in claim 2 wherein:

a. said switching means comprises a pair of unilaterally conductive devices connected respectively at their anode terminals to said second and third nodes and at their cathode terminals to said second current source.

4. A circuit for minimizing voltage excursions on the emitter output terminals of an emitter-follower coupled logic gate due to temperature changes as in claim 3 wherein:

a. said first and second unilaterally conductive devices comprise diodes having their anode terminals commonly connected at a fourth node, said fourth node being connected to said second current source for continuously receiving a predetermined amount of current from said second current source.

5. A circuit for minimizing voltage excursions on the emitter output terminals of an emitter-follower coupled logic gate due to temperature changes as in claim 4 wherein:

a. said second current source comprises a second current source transistor and a serially interconnected impedance means connected between said fourth node and the second power supply means.

6. A circuit for minimizing voltage excursions on the emitter output terminals of an emitter-follower coupled logic gate due to temperature changes as in claim 5 further including:

a. terminal means connected to the base terminal of said second current source transistor for receiving said compensated voltage source means.

7. A circuit for minimizing voltage excursions on the emitter output terminals of an emitter-follower coupled logic gate due to temperature changes as in claim 6 wherein:

a. said compensated voltage source means connected to the respective base terminals of first and second current source transistors is temperature and voltage compensated.

8. A circuit for minimizing voltage excursions on the emitter output terminals of an emitter-follower coupled logic gate due to temperature changes as in claim 7 wherein:

a. said pair of unilaterally conductive devices comprise Schottky barrier diodes.

9. A circuit for minimizing voltage excursions on the emitter output terminals of an emitter-follower coupled logic gate due to temperature changes as in claim 8 further including:

a. a plurality of input switching transistors connected between said first and second nodes.

* * * * *